US012610499B2

(12) United States Patent
Wang et al.

(10) Patent No.: US 12,610,499 B2
(45) Date of Patent: Apr. 21, 2026

(54) POWER SUPPLY WITH AIRFLOW GUIDE MEMBERS

(71) Applicant: Delta Electronics (Shanghai) Co., Ltd., Shanghai (CN)

(72) Inventors: Xinxin Wang, Shanghai (CN); Baohua Li, Shanghai (CN); Xiaojun Wu, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 228 days.

(21) Appl. No.: 18/063,660

(22) Filed: Dec. 8, 2022

(65) Prior Publication Data

US 2023/0200001 A1      Jun. 22, 2023

(30) Foreign Application Priority Data

Dec. 16, 2021    (CN) ......................... 202111543538.3

(51) Int. Cl.
H05K 7/20              (2006.01)

(52) U.S. Cl.
CPC ..... H05K 7/20154 (2013.01); H05K 7/20145 (2013.01); H05K 7/20172 (2013.01)

(58) Field of Classification Search
CPC ........... H05K 7/20145; H05K 7/20909; H05K 7/20918
USPC ....................................................... 361/695
See application file for complete search history.

(56) References Cited

U.S. PATENT DOCUMENTS

| | | | | |
|---|---|---|---|---|
| 5,796,580 | A * | 8/1998 | Komatsu ............ | H05K 7/20727 361/679.48 |
| 5,915,463 | A * | 6/1999 | Romero ................ | H01L 23/473 174/16.3 |
| 10,225,956 | B1 * | 3/2019 | Lee ....................... | G11B 33/128 |
| 10,782,750 | B1 * | 9/2020 | Chen ..................... | F04D 29/582 |
| 2014/0073234 | A1 * | 3/2014 | Elison ................ | H05K 7/20727 361/695 |
| 2015/0283876 | A1 * | 10/2015 | Froehling .......... | B60H 1/00899 165/121 |

(Continued)

FOREIGN PATENT DOCUMENTS

| | | | |
|---|---|---|---|
| CN | 1780546 | A | 5/2006 |
| CN | 101123863 | A * | 2/2008 |

(Continued)

*Primary Examiner* — Mandeep S Buttar
*Assistant Examiner* — Kyle Oxenknecht
(74) *Attorney, Agent, or Firm* — CKC & Partners Co., LLC

(57) ABSTRACT

A power supply with airflow guide members includes a circuit board having a first side and a second side opposite to each other and at least mounted with a first heating element disposed close to the second side, a fan disposed on the first side of the circuit board, a first airflow guide member and a second airflow guide member, the first airflow guide member disposed in parallel to the first heating element, the second airflow guide member at least partially disposed above the first heating element, and adjacent to the first airflow guide member, the first airflow guide member, the second airflow guide member and the first heating element form a first auxiliary air channel, a direction of the first auxiliary air channel is the same as a airflow direction. The power supply with airflow guide members can enhance heat dissipation capability.

19 Claims, 8 Drawing Sheets

(56)                    References Cited

U.S. PATENT DOCUMENTS

| | | | | |
|---|---|---|---|---|
| 2016/0088774 A1 * | 3/2016 | Alvarado | ................. | G06F 1/20 |
| | | | | 29/890.03 |
| 2016/0169429 A1 * | 6/2016 | Lee | ..................... | G01R 31/003 |
| | | | | 165/71 |
| 2019/0145302 A1 * | 5/2019 | Jung | ........................ | F01P 5/04 |
| | | | | 384/394 |
| 2020/0386119 A1 * | 12/2020 | Roberge | ................. | F02C 7/143 |
| 2021/0259091 A1 * | 8/2021 | Zirretta | ............... | H05K 1/0203 |

FOREIGN PATENT DOCUMENTS

| | | | | | | |
|---|---|---|---|---|---|---|
| CN | 101202529 | A | | 6/2008 | | |
| CN | 203675519 | U | | 6/2014 | | |
| CN | 103841792 | B | | 4/2017 | | |
| CN | 104411144 | B | | 11/2017 | | |
| CN | 206727870 | U | | 12/2017 | | |
| CN | 207570101 | U | * | 7/2018 | .......... | H01F 27/025 |
| CN | 112751473 | A | * | 5/2021 | .......... | H01F 27/025 |
| CN | 112954946 | A | * | 6/2021 | ........ | H05K 7/20145 |
| DE | 102017109201 | B3 | * | 8/2018 | .............. | G06F 1/20 |
| JP | 2005348533 | A | * | 12/2005 | ........ | H05K 7/20909 |
| JP | 2020043170 | A | * | 3/2020 | ........ | H05K 7/20145 |
| TW | 201339809 | A | * | 10/2013 | ............ | G06F 1/206 |
| WO | WO-2020175010 | A1 | * | 9/2020 | ....... | H01M 10/0525 |
| WO | WO-2020179171 | A1 | * | 9/2020 | ........ | H01L 23/3672 |

* cited by examiner

B-B

POWER SUPPLY WITH AIRFLOW GUIDE MEMBERS

CROSS-REFERENCE TO RELATED APPLICATIONS

This non-provisional application claims priority under 35 U.S.C. § 119(a) on patent application No. 202111543538.3 filed in P.R. China on Dec. 16, 2021, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

BACKGROUND OF THE INVENTION

1. Field of the Invention

The application relates to the field of power supply technologies, and particularly to a power supply device.

2. Related Art

With an increase of power densities of power supply products, the requirement for heat dissipation of the system also becomes higher. As for an air cooling system, heat dissipation of devices at downstream of air channels has become a bottleneck of heat dissipation of the air cooling system. As shown in FIG. 1A, a fan 1 is disposed on a left side of the power supply product, and an air channel is formed from air inlets on the left side to an air outlet on a right side, wherein an airflow direction is from left to right. When electronic elements at upstream of the air channel are high and installed densely, and power dissipation of transformers T1 and T2 located downstream of the air channel is large, the temperature of the transformers T1 and T2 is difficult to satisfy the application requirement. Heat dissipation capability of the system shall be enhanced.

With respect to the problem, the prior art provides some solutions. For example, as shown in FIG. 1B, one solution is to dispose heatsink 2 on a printed wiring board (PWB) of the transformer T1/T2, and in contact with the PWB to conduct heat by dispensing a heat conducting grease, thereby achieving the purpose of heat dissipation. However, in such solution, the temperature of the transformer T1/T2 (for example 126° C.) under normal working conditions, which cannot satisfy use requirement. It takes long time to solve the issue with high material cost. Another solution is to select fans with larger flow to increase heat dissipation. But such solution brings the problems of increased energy consumption and increased noise of the system.

Therefore, it is urgent to provide a new heat dissipation method to achieve the object of cooling the power supply products.

SUMMARY OF THE INVENTION

An object of the application is to provide a power supply device, which can solve the problem of high temperature of electronic elements in the prior art, and may effectively enhance heat dissipation capability of the system.

In order to achieve the above object, the application provides a power supply device, including: a circuit board having a first side and a second side opposite to each other, wherein a first heating element is mounted on the circuit board and disposed close to the second side of the circuit board; a fan disposed on the first side of the circuit board, wherein the fan is used to provide an air-cooled airflow for heat dissipation, and an airflow direction is defined from the first side to the second side; a first airflow guide member disposed in parallel to the first heating element; and a second airflow guide member at least partially disposed above the first heating element, wherein the second airflow guide member is adjacent to the first airflow guide member, and the first airflow guide member, the second airflow guide member and the first heating element form a first auxiliary air channel; wherein a direction of the first auxiliary air channel is the same as the airflow direction, and the power supply device increases an air velocity and an air flow quantity through the first auxiliary air channel.

The application achieves the object of cooling through the heat dissipation method of improving the air velocity and an effective air quantity flowing the heating element. By means of the application, design of air guide structure can change the flow velocity and the direction of the airflow in a two-dimensional space, and can also change airflow characteristics of three dimensions in space by at least partially disposing the second airflow guide member above the second transformer, and allowing the airflow of the fourth auxiliary air channel and the airflow of the third auxiliary air channel to converge in the first auxiliary air channel. The application has good heat dissipation effect, low manufacturing cost, and high working efficiency.

The additional aspects and advantages of the application are partially explained in the below description, and partially becoming apparent from the description, or can be obtained through the practice of the application.

BRIEF DESCRIPTION OF THE DRAWINGS

The exemplary embodiments are described in details with reference to the accompanying drawings, through which the above and other features and advantages of the application will become more apparent.

DETAILED EMBODIMENTS OF THE INVENTION

Figure 1A:
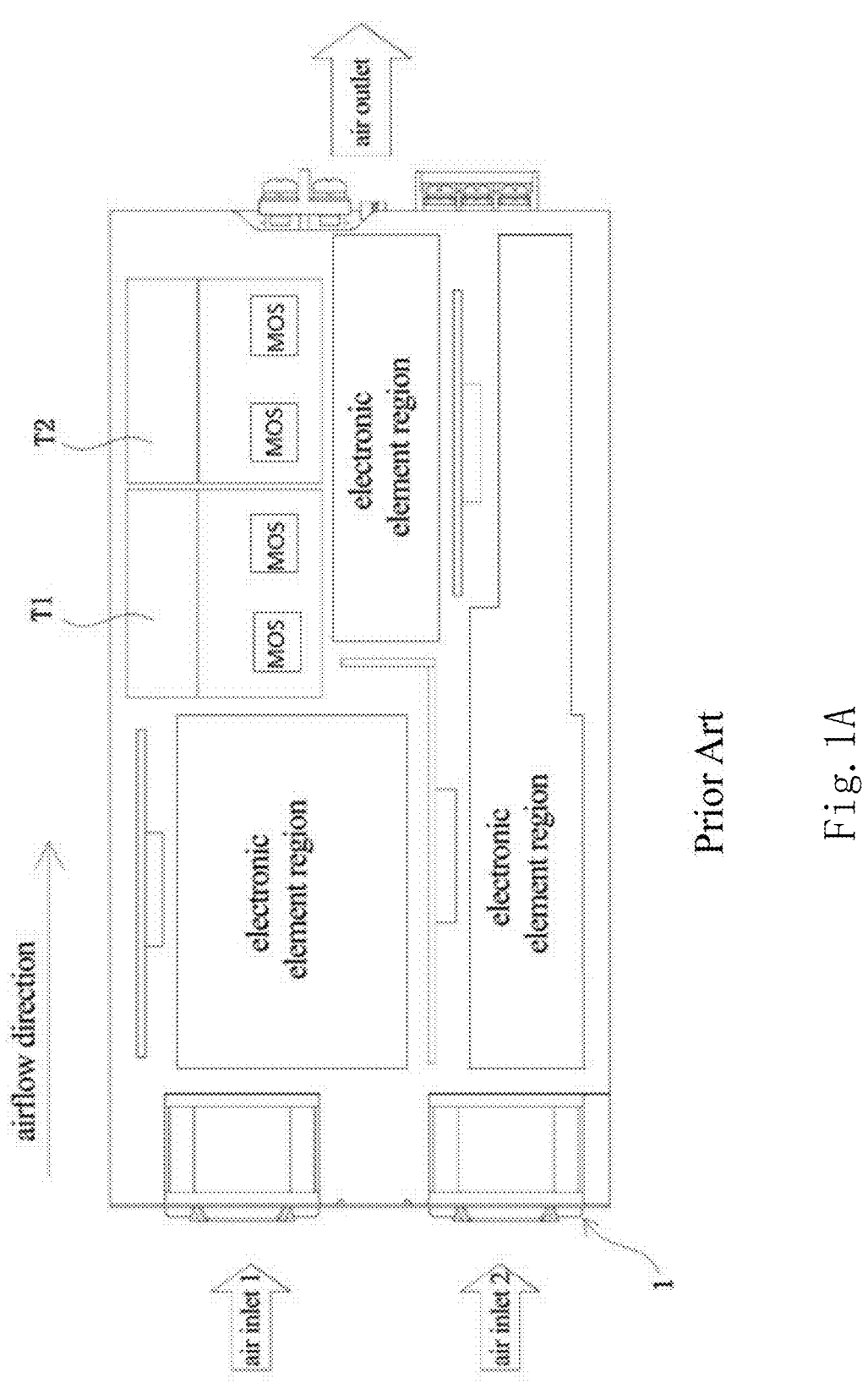
FIG. 1A is a structural diagram of a conventional power supply product.
Figure 1B:
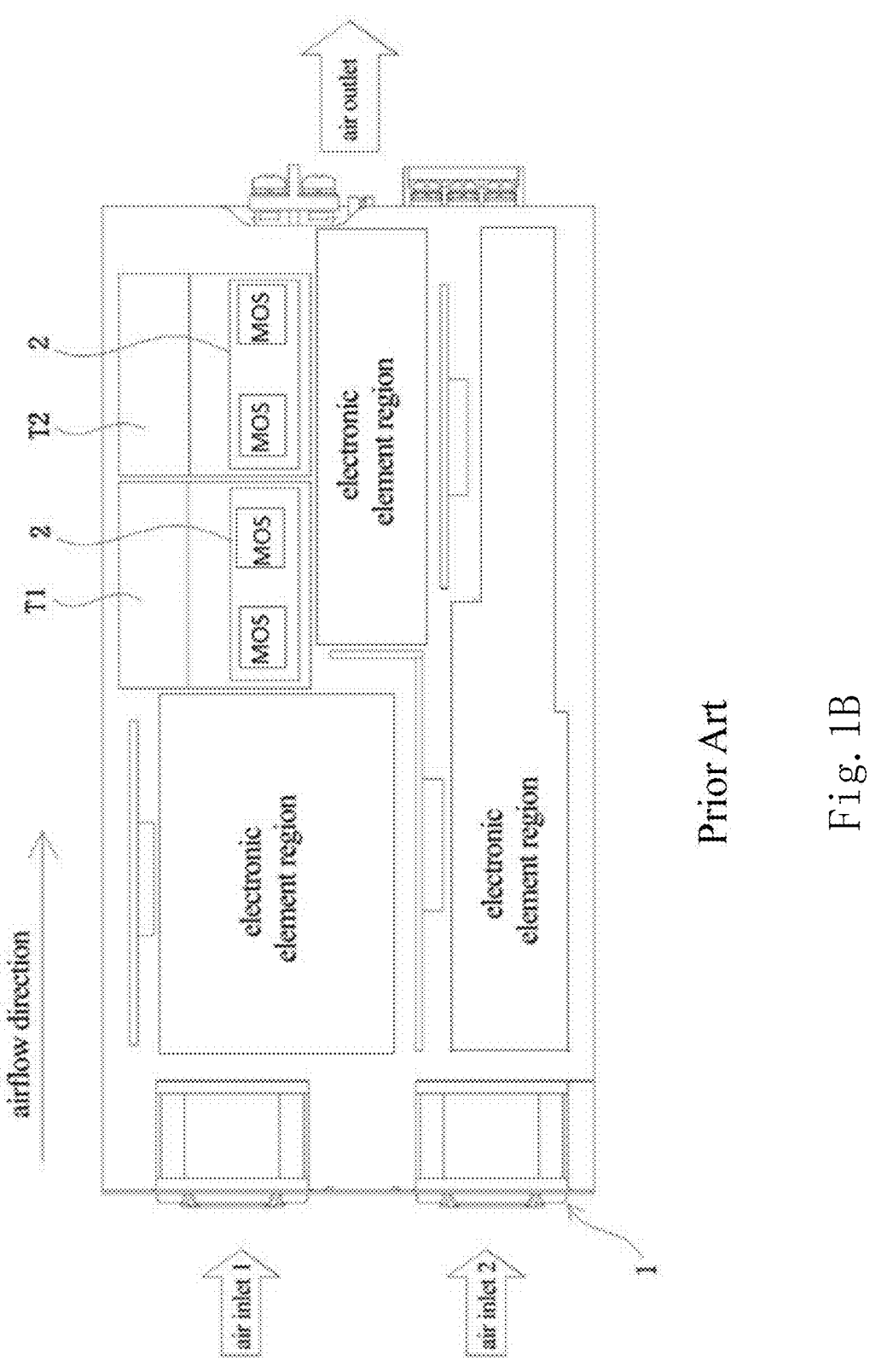
FIG. 1B is a structural diagram of a heat dissipation solution of the conventional power supply product.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this application will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a (an)", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It shall be understood that if the signed device reverses to turn upside down, the described component on an "upper" side will become a component on a "lower" side. In addition, the terms "first", "second" and the like in the claims are only used as signs, instead of numeral limitations to objects.

Figure 2A:
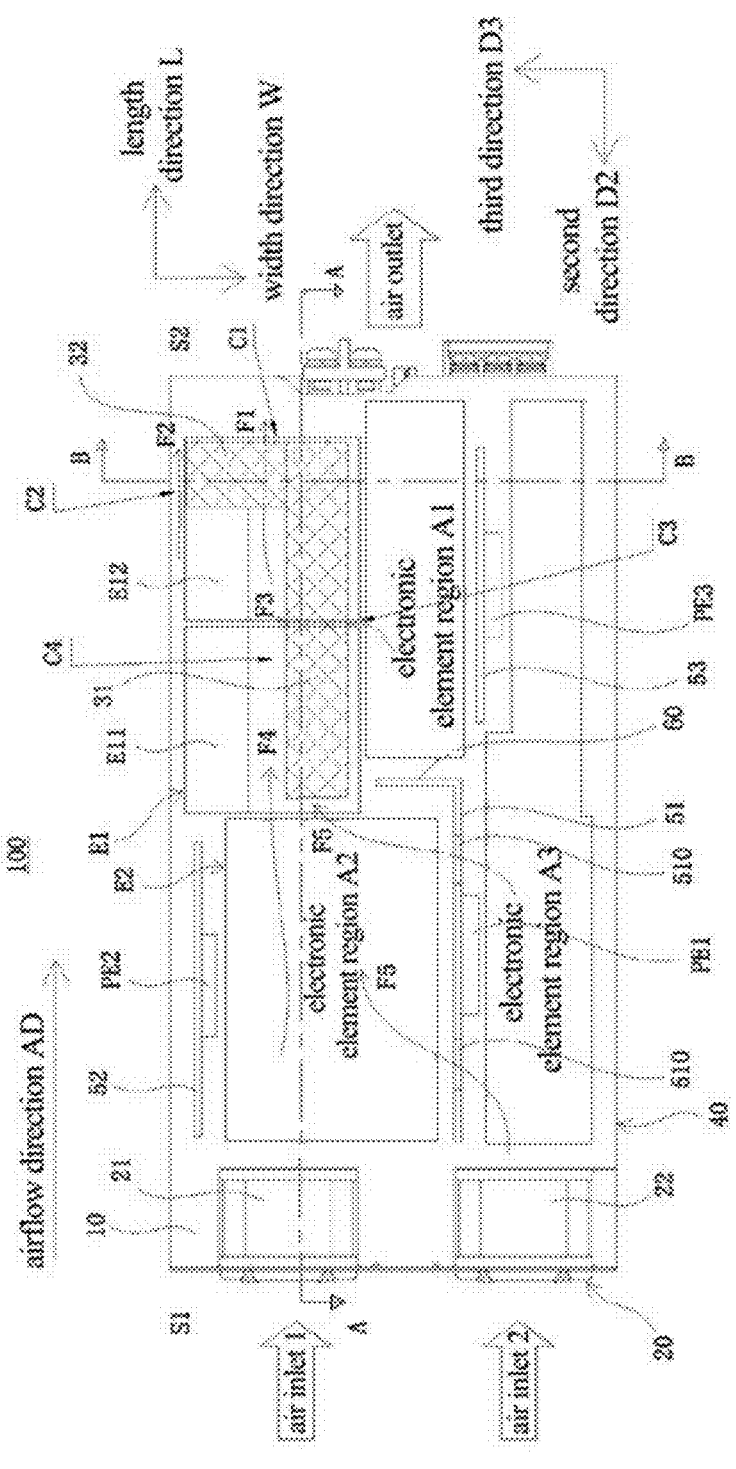
FIG. 2A is a structural diagram of a power supply device in a first embodiment of the application.
Figure 2B:
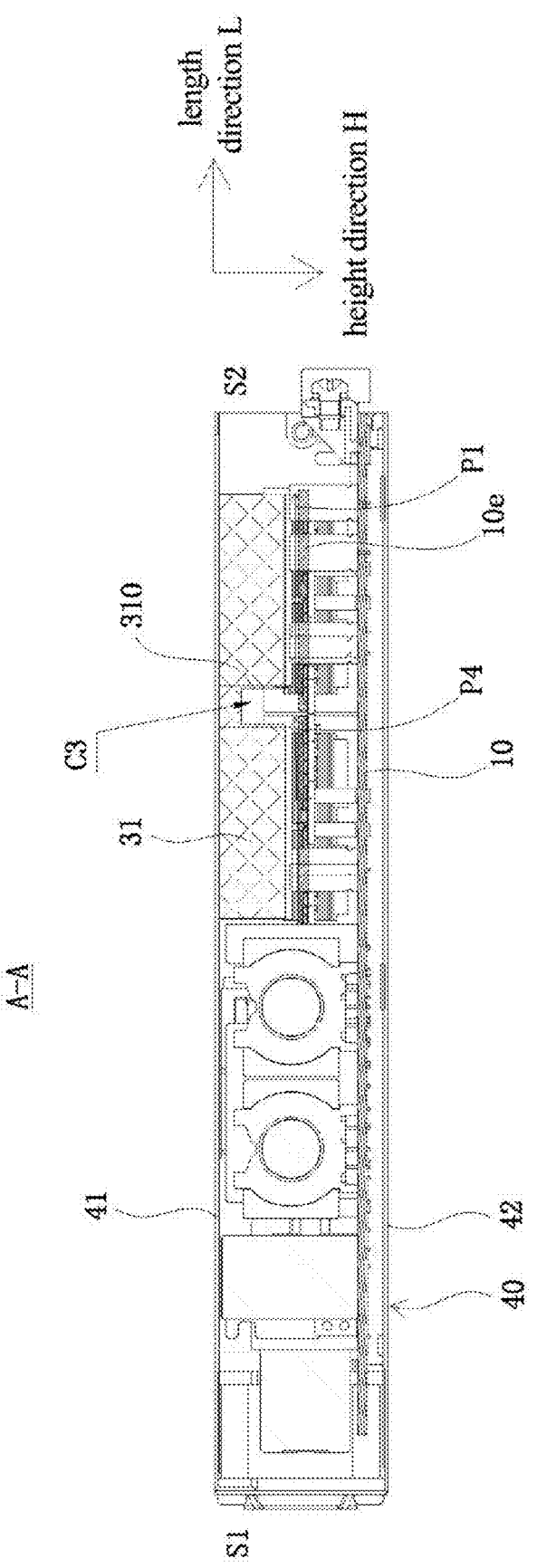
FIG. 2B is a sectional diagram along a direction A-A in FIG. 2A.
Figure 2C:
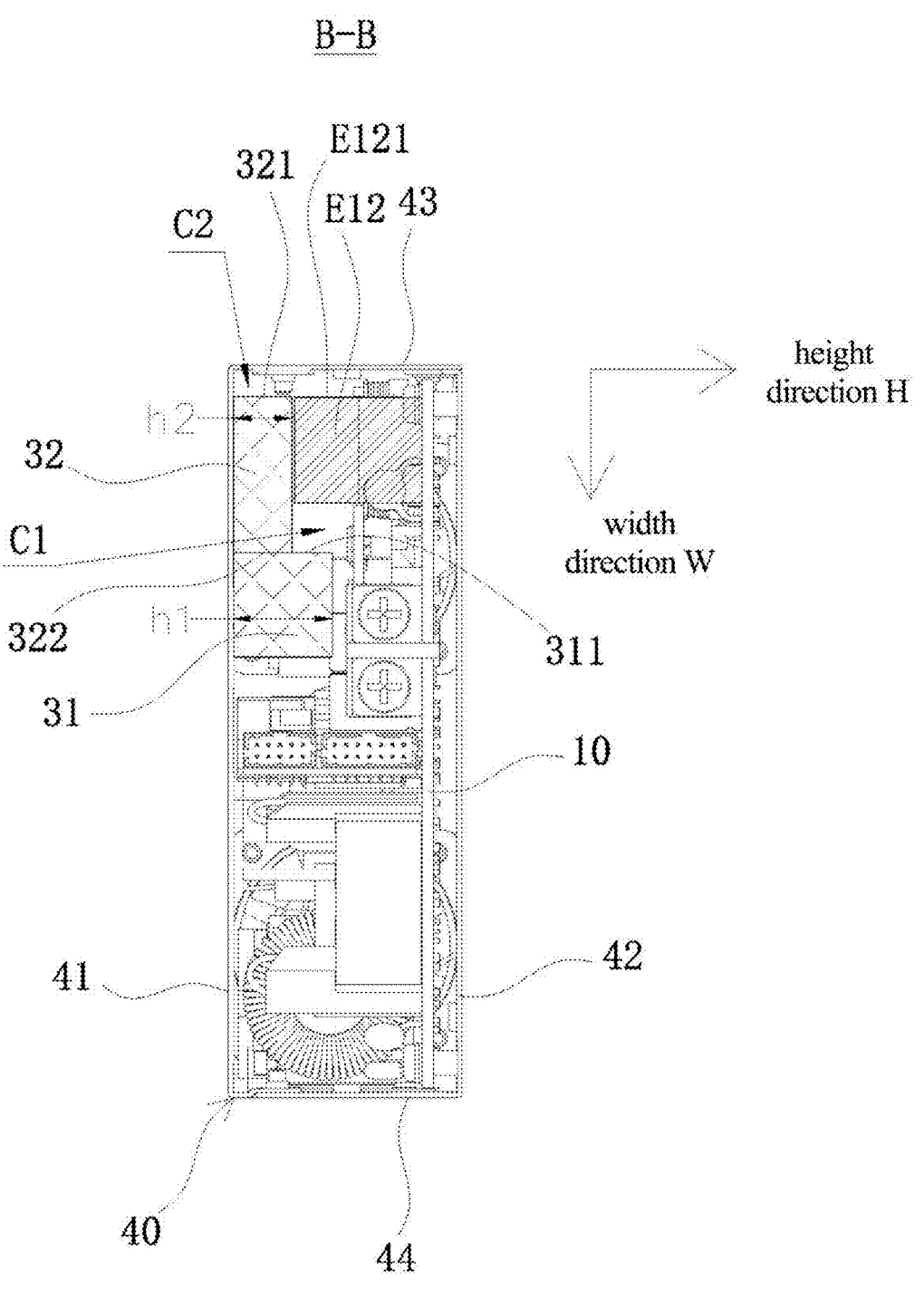
FIG. 2C is a sectional diagram along a direction B-B in FIG. 2A.

As shown in FIGS. 2A to 2C, a power supply device 100 in a first embodiment of the application mainly includes a circuit board 10, a fan 20, a first airflow guide member 31 and a second airflow guide member 32. As shown in FIG. 2A, the circuit board 10 has a first side S1 (i.e., a left side in FIG. 2A) and a second side S2 (i.e., a right side in FIG. 2A) opposite to each other. The circuit board 10 is at least mounted with a first heating element E1, for example, disposed close to the second side S2. The fan 20, for example, is disposed on the first side S1 of the circuit board 10 for providing an air-cooled airflow for heat dissipation. In the embodiment, an airflow direction AD is defined from the first side S1 to the second side S2, and is parallel to a length direction L. For example, the air-cooled airflow flowing from the first side S1 to the second side S2 may be formed by the fan 20 using air inlets formed on the first side S1 and an air outlet formed on the second side S2. In this embodiment, the fan 20, for example, may include a first fan 21 and a second fan 22 disposed close to the first side S1 (i.e., an upstream position) and arranged at an interval along a width direction W, such that the air inlet 1 and the air inlet 2 may be formed on the first side S1.

Referring to FIGS. 2A to 2C, in the first embodiment of the application, the first airflow guide member 31 is disposed parallel to the first heating element E1 along the width direction W (clearly shown in FIG. 2C). The second airflow guide member 32 is at least partially disposed above the first heating element E1, and adjacent to the first airflow guide member 31. Moreover, the first airflow guide member 31, the second airflow guide member 32 and the first heating element E1 together form a first auxiliary air channel C1 (clearly shown in FIG. 2C), and a direction of the first auxiliary air channel C1 is the same as the airflow direction AD. The power supply device 100 may increase an air velocity and an air flow quantity through the first auxiliary air channel C1. In such way, the application may achieve the object of cooling through the heat dissipation method of improving the air velocity and an effective air quantity flowing the heating element.

In some embodiments of the application, the first heating element E1, for example, may include a transformer. As shown in FIG. 2A, the first heating element E1, for example, includes a first transformer E11 and a second transformer E12 arranged at an interval along the airflow direction AD. In the first embodiment shown in FIGS. 2A to 2C, the first transformer E11 and the second transformer E12 may have the same height. Moreover, the first transformer E11 and the second transformer E12, for example, may be mounted on the circuit board 10 through a wiring board 10e (as shown in FIG. 2B) of the transformer. Of course, it can be understood that in other embodiments, the first heating element E1 can also be other electronic elements, the number can also be one or more, and the height of these electronic elements can also be different, but the application is not limited thereto.

In the first embodiment shown in FIGS. 2A to 2C, the second airflow guide member 32, for example, may be at least partially disposed above the second transformer E12, and extend to contact with a magnetic core of the second transformer E12 in a height direction H.

In some embodiments of the application, as shown in FIGS. 2A to 2C, the power supply device 100 may further include a casing 40. The casing 40 may have a top 41 and a bottom 42 opposite to each other along the height direction H, the circuit board 10 may be disposed on the bottom 42 of the casing 40, and the first airflow guide member 31 and the second airflow guide member 32 may be both fixed on the top 41 of the casing 40. The casing 40 may also have a sidewall 43 and a sidewall 44 opposite to each other along the width direction W.

In some alternative embodiments, the first airflow guide member 31 and the second airflow guide member 32, for example, may be stop blocks, and may be made of a foam material, but the application is not limited thereto. Moreover, as shown in FIG. 2C, a thickness h1 of the first airflow guide member 31 in the height direction H is greater than a thickness h2 of the second airflow guide member 32 in the height direction H.

In some alternative embodiments, referring to FIGS. 2A and 2C, the second airflow guide member 32 may have a first sidewall 321 paralleled to a sidewall of the first heating element E1. And the sidewall of the first heating element E1 is close to the casing 40, and as shown in FIG. 2C, the first sidewall 321 is paralleled to a sidewall E121 of the second transformer E12. In addition, a second auxiliary air channel C2 (clearly shown in FIG. 2C) may be further formed between the first sidewall 321 of the second airflow guide member 32 and the casing 40, a direction of the second auxiliary air channel C2 is the same as the airflow direction AD, and an airflow F2 flowing through the second auxiliary air channel C2 may further increase an air velocity and an air flow quantity.

In this embodiment, as shown in FIG. 2A, a cross section of the first airflow guide member 31 in the length direction L and a cross section of the second airflow guide member 32 in the length direction L form an L shape. Referring to FIG. 2C, a longitudinal section of the first airflow guide member 31 in the width direction W and a longitudinal section of the second airflow guide member 32 in the width direction W also form an L shape. Moreover, the second airflow guide member 32 has a second sidewall 322 adhered to the sidewall 311 of the first airflow guide member 31 close to the first heating element E1.

In one embodiment of the application, the first airflow guide member 31 and the second airflow guide member 32 may be individual components that are made respectively. In other embodiments, the first airflow guide member 31 and the second airflow guide member 32 may also be integrally made, but the application is not limited thereto.

In some embodiments of the application, as shown in FIG. 2B, the first airflow guide member 31 may also have a groove 310 with an opening facing the circuit board 10, and a third auxiliary air channel C3 is formed in the groove 310, and referring to FIG. 2A, a direction of the third auxiliary air channel C3 has a third direction D3 perpendicular to the airflow direction AD.

In some embodiments of the application, as shown in FIG. 2A, a fourth auxiliary air channel C4 may also be formed between the first airflow guide member 31 and the first heating element E1. For example, the fourth auxiliary air channel C4 may be formed between the first airflow guide member 31 and the first transformer E11. Moreover, an airflow F4 of the fourth auxiliary air channel C4 and an airflow F3 of the third auxiliary air channel C3 may converge in the first auxiliary air channel C1 to form an airflow F1 flowing through the first auxiliary air channel C1. Therefore, design of air guide structure in the application can change the air velocity and the direction of the airflow in a two-dimension space, and can also change airflow characteristics of three dimensions in space by at least partially disposing the second airflow guide member 32 above the second transformer E12, and allowing the airflow of the fourth auxiliary air channel C4 and the airflow of the third auxiliary air channel C3 to converge in the first auxiliary air channel C1. A direction of the fourth auxiliary air channel C4 is the same as the airflow direction AD. The air velocity and the air flow quantity can be further increased through the third auxiliary air channel C3 and the fourth auxiliary air channel C4.

In some embodiments of the application, as shown in FIG. 2A, the power supply device 100 may further include a first heat sink 51 and a second heating element E2. The first heat sink 51, for example, may extend along the airflow direction AD, and located midstream of the airflow direction AD. The second heating element E2, for example, may be disposed on the circuit board 10, and located among the fan 20, the first heat sink 51 and the first heating element E1, for example, in an electronic element region A2 in FIG. 2A.

In some embodiments of the application, as shown in FIG. 2A, the power supply device 100 may further include a guide plate 60 extending along a third direction D3, and the third direction D3 is perpendicular to the airflow direction AD. The guide plate 60 is vertically connected to the first heat sink 51, and configured to guide a part of the air-cooled airflow to the first heating element E1.

As shown in FIG. 2A, the first heat sink 51 may include one or more air guide grooves 510, and the air guide groove is configured to guide a part of the air-cooled airflow to the first heating element E1 and the second heating element E2. For example, the first heat sink 51 includes a plurality of air guide grooves 510, and the plurality of air guide grooves 510 may be arranged at intervals along the airflow direction AD. The air flow quantity flowing the first heating element E1 and the second heating element E2 can be increased through the air guide grooves 510 and the guide plate 60. For example, the air-cooled airflow generated by the second fan 22 may be guided to the first heating element E1 and the second heating element E2.

In some embodiments of the application, the power supply device 100 may further include a second heat sink 52 and/or a third heat sink 53. The second heat sink 52 may extend along the airflow direction AD, located on one side of the second heating element E2 away from the first heat sink 51, and adjacent to one sidewall (a sidewall 43 in FIG. 2C) of the casing 40. The third heat sink 53 may extend along the airflow direction AD, located downstream of the airflow direction AD, and close to the second side S2. An electronic element region A1 between the third heat sink 53 and the first heating element E1 can also be provided with other electronic elements. An electronic element region A3 among the first heat sink 51, the third heat sink 53 and another sidewall (a sidewall 44 in FIG. 2C) of the casing 40 can also be provided with other electronic elements.

In one embodiments of the application, the first heat sink 51, the second heat sink 52 and/or the third heat sink 53 may be disposed on the circuit board 10. In other embodiments, the first heat sink 51, the second heat sink 52 and the third heat sink 53 may also be thermally connected to power devices PE1, PE2 and PE3 for dissipating heat from the power devices PE1, PE2 and PE3.

Figure 3A:
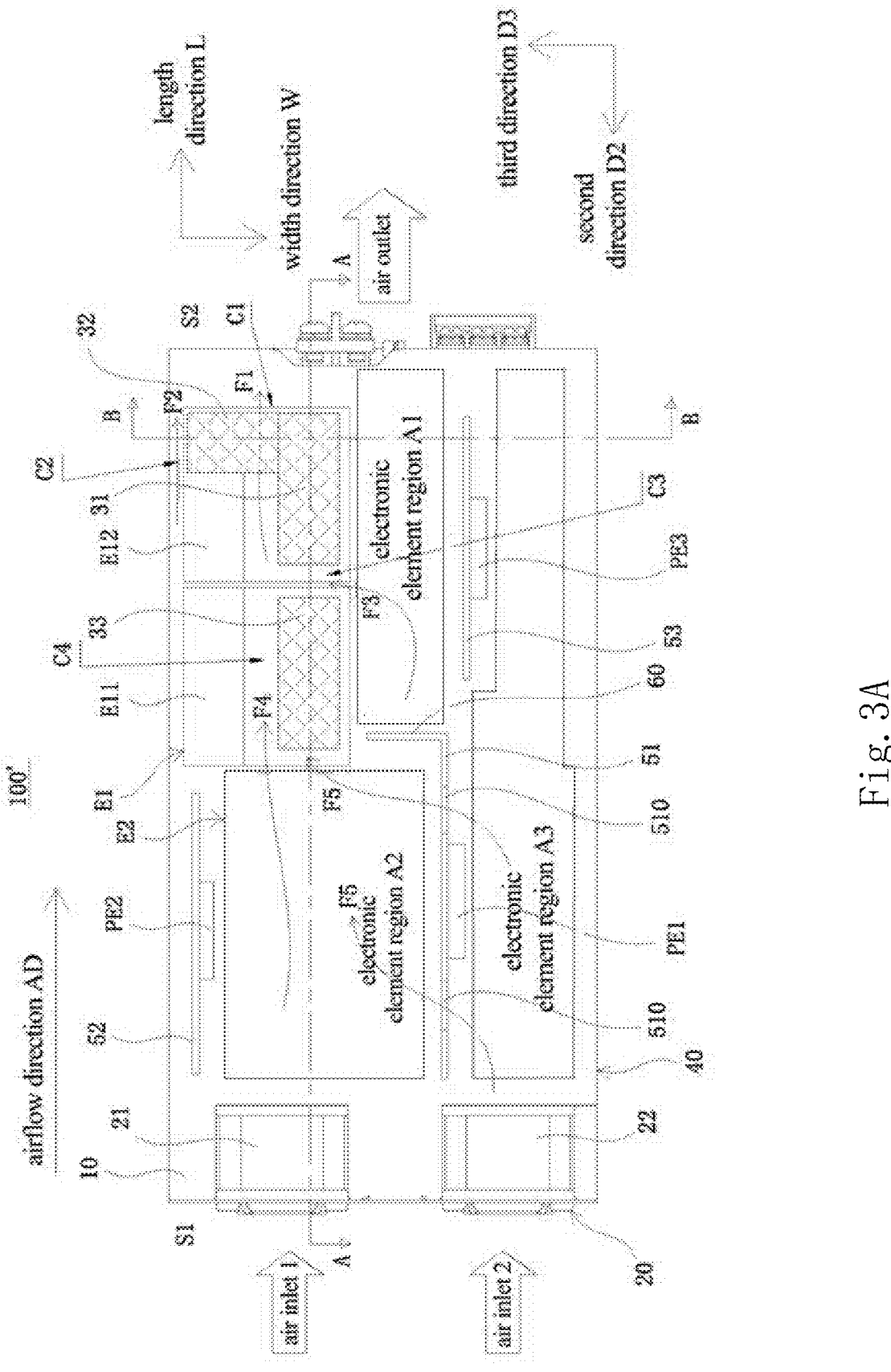
FIG. 3A is a structural diagram of a power supply device in a second embodiment of the application.
Figure 3B:
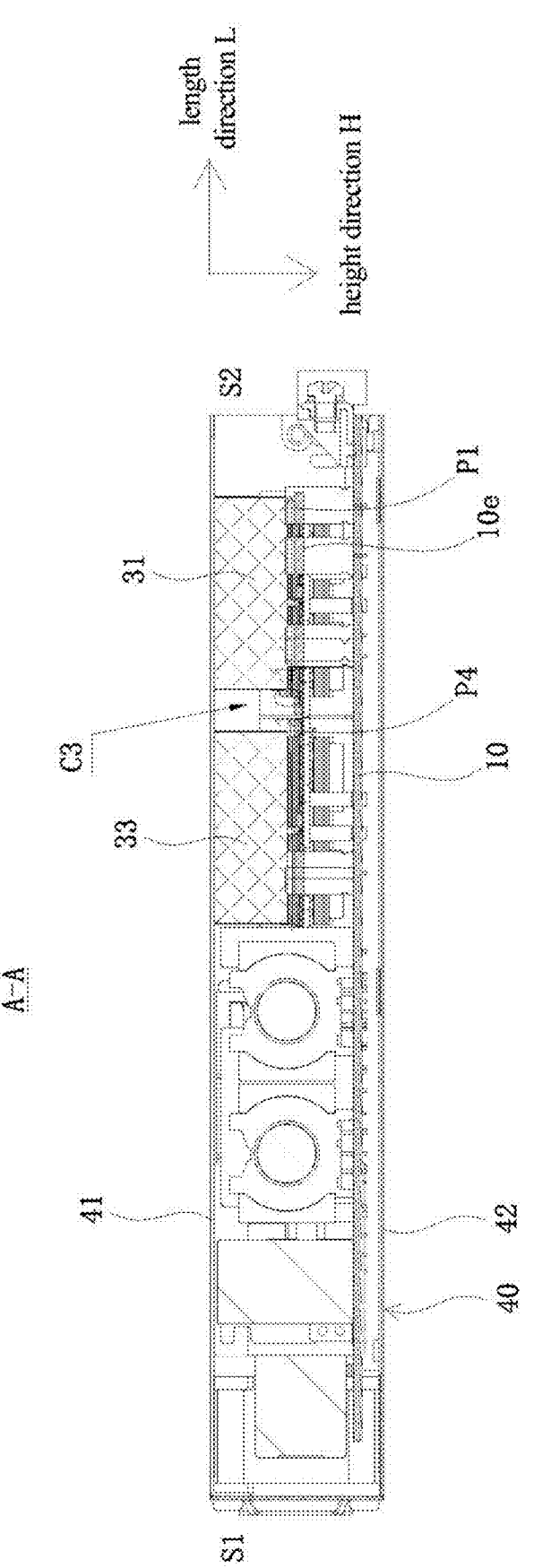
FIG. 3B is a sectional diagram along a direction A-A in FIG. 3A.
Figure 3C:
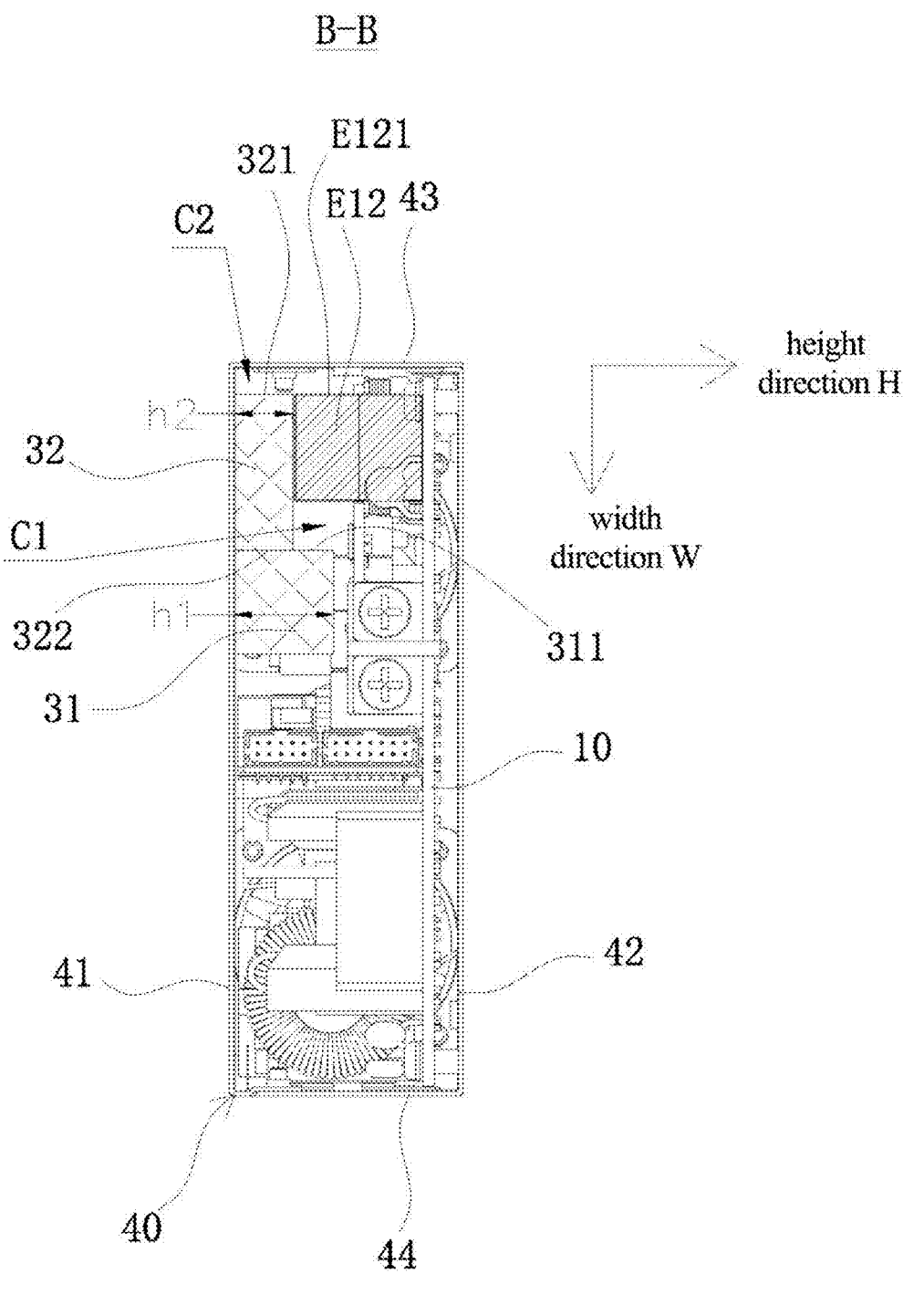
FIG. 3C is a sectional diagram along a direction B-B in FIG. 3A.

As shown in FIGS. 3A to 3C, they illustrate a structure of a power supply device 100' in a second embodiment of the application. Different from the first embodiment shown in FIGS. 2A to 2C, the power supply device 100' further includes a third airflow guide member 33 arranged at an interval with the first airflow guide member 31 along a second direction D2 opposite to the airflow direction AD. A third auxiliary air channel C3 is formed between the third airflow guide member 33 and the first airflow guide member 31 (referring to FIGS. 3A and 3B), and a direction of the third auxiliary air channel C3 has a third direction D3 perpendicular to the airflow direction AD.

In this embodiment, the third airflow guide member 33 may be arranged at an interval with the first heating element E1, and a fourth auxiliary air channel C4 is formed between the third airflow guide member 33 and the first heating element E1, and an airflow F4 of the fourth auxiliary air channel C4 and an airflow F3 of the third auxiliary air channel C3 converge in the first auxiliary air channel C1 to form an airflow F1. Similarly with the illustrative embodiment of FIG. 2A, design of air guide structure in the embodiment of FIG. 3A can change the flow velocity and the direction of the airflow in a two-dimensional space, and can also change airflow characteristics of three dimensions in space by at least partially disposing the second airflow guide member 32 above the second transformer E12, and allowing the airflow of the fourth auxiliary air channel C4 and the airflow of the third auxiliary air channel C3 to converge in the first auxiliary air channel C1. A direction of the fourth auxiliary air channel C4 is the same as the airflow direction AD. For example, the first airflow guide member 31 and the second transformer E12 may be arranged in parallel and at an interval relatively to form the first auxiliary air channel C1 together with the second airflow guide member 32, and the third airflow guide member 33 and the first transformer E11 may be arranged in parallel and at an interval relatively to form the fourth auxiliary air channel C4.

The application realizes the heat dissipation by improving the air velocity and an effective air quantity flowing the heating element, thereby overcoming the problem of incapable of further improving high temperature of the heating elements located downstream of the air channel by adjusting layout of the elements due to limitation of internal space of the power supply device in the prior art.

As compared to the prior art, the application has at least one of the following advantageous effects:

(1) good heat dissipation effect. The application may obviously reduce the temperature of the heating elements in the power supply device, for example, reducing the temperature of the transformer and the temperature of switches distributed on the transformer wiring board, thereby improving heat dissipation capability of the product. When comparing testing results between the application and the prior art, under the same or similar condition, the temperature of the transformer at most falls 12° C., and reaches 114° C., and the temperature of the MOS switches falls 13° C., and may reach the expected effect, such that the product reaches the design requirement.

(2) low manufacturing cost. In the prior art, the heat dissipation effect is not ideal, and manufacturing cost of the heat sinks is high (about 10.6 RMB). However, in the application, by virtue of design of the novelty air channel, cost may be reduced, and each product may save a material cost of about 9 RMB.

(3) high working efficiency. In the prior art, fixing the heat sinks shall increase labor cost and wait for curing of the grease, working efficiency is low. However, the proposed method simplifies the operation and lowers labor cost.

Exemplary embodiments of the application are illustrated and described in details. It shall be understood that the application is not limited to the disclosed embodiments, and in contrast, the application aims to cover various modifications and equivalent arrangements included in principle and scope of the appended claims.

What is claimed is:

1. A power supply device, comprising:
a circuit board having a first side and a second side opposite to each other, wherein a first heating element is mounted on the circuit board and disposed close to the second side of the circuit board;
a fan disposed on the first side of the circuit board, wherein the fan is used to provide an air-cooled airflow for heat dissipation, and an airflow direction is defined from the first side to the second side, a second heating element disposed on the circuit board, and located between the fan and the first heating element along the airflow direction;
a first airflow guide member disposed in parallel to the first heating element; and
a second airflow guide member at least partially disposed above the first heating element, wherein the second airflow guide member is adjacent to the first airflow guide member, and the first airflow guide member, the second airflow guide member and the first heating element form a first auxiliary air channel;
wherein a direction of the first auxiliary air channel is the same as the airflow direction, and the power supply device increases an air velocity and an air flow quantity through the first auxiliary air channel;
a casing, having a top and a bottom, wherein the circuit board is disposed on the bottom of the casing;
wherein the second airflow guide member has a first sidewall, and the first sidewall is parallel to a sidewall of the first heating element close to the casing, and a second auxiliary air channel is formed between the first sidewall and the casing, and a direction of the second auxiliary air channel is the same as the airflow direction, and a thickness of the first airflow guide member is greater than a thickness of the second airflow guide member.

2. The power supply device according to claim 1, wherein the first airflow guide member and the second airflow guide member are both fixed on the top of the casing.

3. The power supply device according to claim 2, wherein the first airflow guide member and the second airflow guide member are both blocks that change the direction of the air-cooled airflow.

4. The power supply device according to claim 3, wherein a cross section of the first airflow guide member and a cross section of the second airflow guide member form an L shape.

5. The power supply device according to claim 4, wherein the second airflow guide member has a second sidewall, and the second sidewall is adhered to a sidewall of the first airflow guide member close to the first heating element.

6. The power supply device according to claim 4, wherein the first airflow guide member and the second airflow guide member are integrally made.

7. The power supply device according to claim 1, wherein the first airflow guide member has a groove, and an opening of the groove faces the circuit board, a third auxiliary air channel is formed in the groove, and a direction of the third auxiliary air channel has a third direction perpendicular to the airflow direction.

8. The power supply device according to claim 7, wherein a fourth auxiliary air channel is formed between the first airflow guide member and the first heating element, an airflow of the fourth auxiliary air channel and an airflow of the third auxiliary air channel converge in the first auxiliary air channel, and a direction of the fourth auxiliary air channel is the same as the airflow direction.

9. The power supply device according to claim 1, further comprising a third airflow guide member, wherein the third airflow guide member is arranged at an interval with the first airflow guide member along the airflow direction, wherein a third auxiliary air channel is formed between the third airflow guide member and the first airflow guide member, and a direction of the third auxiliary air channel has a third direction perpendicular to the airflow direction.

10. The power supply device according to claim 9, wherein the third airflow guide member is arranged at an interval with the first heating element, wherein,
a fourth auxiliary air channel is formed between the third airflow guide member and the first heating element, an airflow of the fourth auxiliary air channel and an airflow of the third auxiliary air channel converge in the first auxiliary air channel, and a direction of the fourth auxiliary air channel is the same as the airflow direction.

11. The power supply device according to claim 1, further comprising:
a first heat sink extending along the airflow direction, and located midstream of the airflow direction; and
the second heating element disposed on the circuit board, and located among the fan, the first heat sink and the first heating element.

12. The power supply device according to claim 11, further comprising:
a guide plate extending along a third direction perpendicular to the airflow direction, wherein the guide plate is vertically connected to the first heat sink, and configured to guide a part of the air-cooled airflow to the first heating element.

13. The power supply device according to claim 11, wherein the first heat sink comprises an air guide groove, and the air guide groove is configured to guide a part of the air-cooled airflow to the first heating element and the second heating element.

14. The power supply device according to claim 13, wherein the first heat sink comprises a plurality of air guide grooves, and the plurality of air guide grooves are arranged at intervals along the airflow direction.

15. The power supply device according to claim 11, further comprising:

a second heat sink extending along the airflow direction, wherein the second heat sink is located on one side of the second heating element away from the first heat sink, and adjacent to one sidewall of the casing; and/or a third heat sink extending along the airflow direction, wherein the third heat sink is located downstream of the airflow direction, and close to the second side of the circuit board.

16. The power supply device according to claim 1, wherein the first heating element comprises a transformer.

17. The power supply device according to claim 1, wherein the first heating element comprises a first transformer and a second transformer arranged at an interval along the airflow direction, wherein the first transformer and the second transformer have a same height.

18. The power supply device according to claim 17, wherein the second airflow guide member is at least partially disposed above the second transformer, and extends to contact with a magnetic core of the second transformer in a height direction.

19. The power supply device according to claim 1, wherein the first airflow guide member and the second airflow guide member are made of a foam material.

\* \* \* \* \*